United States Patent
Wong

(10) Patent No.: US 7,098,751 B1
(45) Date of Patent: Aug. 29, 2006

(54) TUNABLE CAPACITANCE CIRCUIT FOR VOLTAGE CONTROL OSCILLATOR

(75) Inventor: Kim Yeow Wong, Renton, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 8 days.

(21) Appl. No.: 10/928,333

(22) Filed: Aug. 27, 2004

(51) Int. Cl.
   *H03B 19/14* (2006.01)

(52) U.S. Cl. .............................. 331/177 V; 331/36 C; 331/117 R

(58) Field of Classification Search .............. 331/36 C, 331/177 V
   See application file for complete search history.

(56) References Cited

U.S. PATENT DOCUMENTS

| | | | |
|---|---|---|---|
| 5,038,184 A | 8/1991 | Chiang et al. | |
| 6,172,378 B1 | 1/2001 | Hull et al. | |
| 6,351,020 B1 | 2/2002 | Tarabbia et al. | |
| 6,407,412 B1 | 6/2002 | Iniewski et al. | |
| 6,469,587 B1 | 10/2002 | Scoggins | |
| 6,521,939 B1 | 2/2003 | Yeo et al. | |
| 6,627,954 B1 | 9/2003 | Seefeldt | |
| 6,650,195 B1 * | 11/2003 | Brunn et al. ............. | 331/177 V |
| 6,653,716 B1 | 11/2003 | Vashchenko et al. | |
| 6,667,539 B1 | 12/2003 | Adler | |
| 2003/0202313 A1 * | 10/2003 | Hsu et al. ................. | 361/177 |
| 2003/0227341 A1 * | 12/2003 | Sawada ................... | 331/177 V |

OTHER PUBLICATIONS

Maget, Judith et al., "Influence of Novel MOS Varactors on the Performance of a Fully Integrated UMTS VCO in Standard 0.25um CMOS Technology," IEEE JSSC, vol. 37, No. 7, Jul. 2002, pp. 1-6.
Oh, Seung-Min et al., "A 74% 1.56-2.71 GHz, Wide-Tunable LC-Tuned VCO in 0.35-um CMOS Technology," Microwave and Optical Technology Letters/vol. 37, No. 2, Apr. 20, 2003, pp. 98-100.
Andreani, Pietro and Mattisson, Sven, "On the Use of MOS Varactors in RF VCO's, " IEEE JSSC, vol. 35, No. 6, Jun. 2000, pp. 905-910.
Soorapanth, Theerachet et al., "Analysis and Optimization of Accumulation-Mode Varactor for RF ICs," 1998 Symposium on VLSI Circuits Digest of Technical Papers, pp. 32-33.
Andreani, Pietro and Mattisson, Sven. "A 1.6-GHz CMOS VCO Tuned By An Accumulation-Mode MOS Varactor," Published in 1999 Proceedings, 17th NORCHIP conference, Oslo, Norway, Conference date: Nov. 8-9, 1999, 4 pages.
Rios, Rafael et al., "An Analytic Polysilicon Depletion Effect Model For MOSFET's", IEEE Electron Device Letters, vol. 15, No. 4, Apr. 1994, pp. 129-131.

* cited by examiner

*Primary Examiner*—Joseph Chang
(74) *Attorney, Agent, or Firm*—Vedder, Price, Kaufman & Kammholz, P.C.

(57) ABSTRACT

A circuit and method for providing a tunable capacitance for a voltage control oscillator (VCO) in which at least one P-N junction varactor and at least one metal oxide semiconductor (MOS) accumulation-mode varactor are effectively coupled and tuned in parallel, thereby providing a net tunable capacitance with which the VCO will realize an optimal combination of quality factor, phase noise, and gain characteristics.

18 Claims, 3 Drawing Sheets

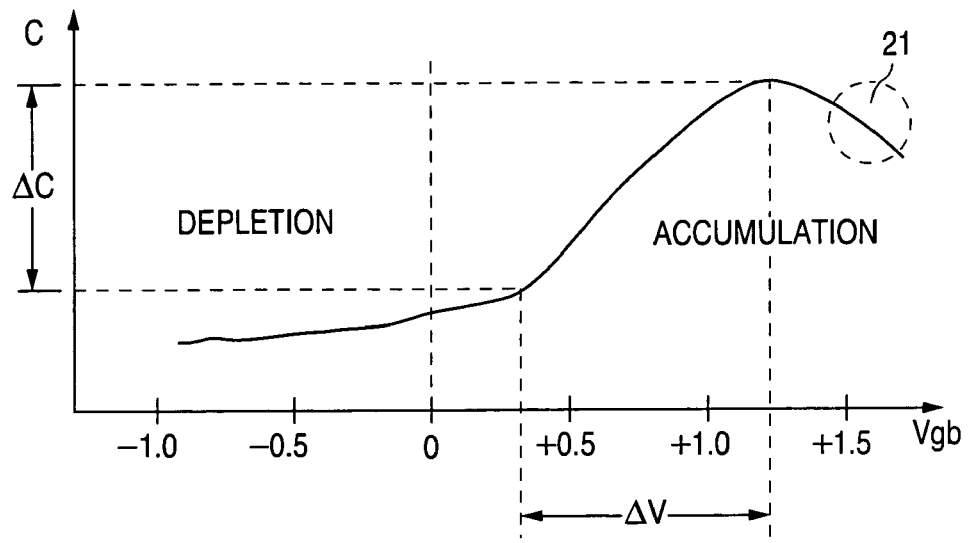
FIG. 2C
(PRIOR ART)
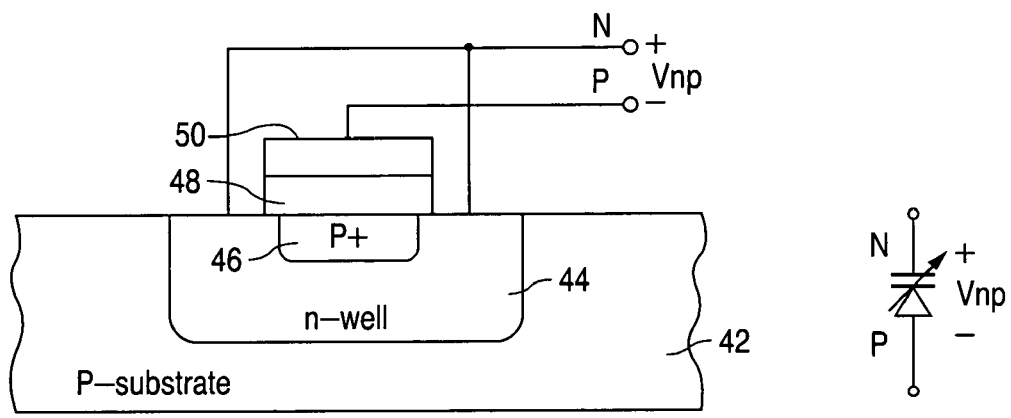
FIG. 3A
(PRIOR ART)
FIG. 3B
(PRIOR ART)
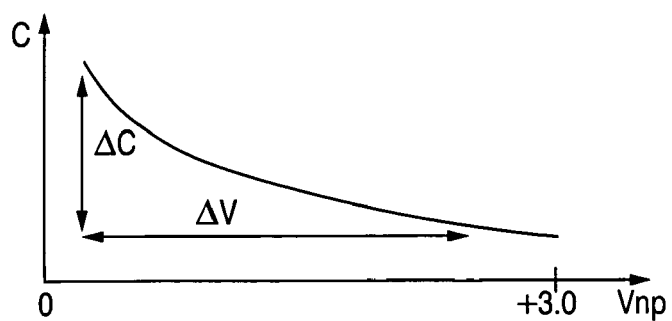
FIG. 3C
(PRIOR ART)

TUNABLE CAPACITANCE CIRCUIT FOR VOLTAGE CONTROL OSCILLATOR

BACKGROUND OF THE INVENTION

1. Field of the Invention

The present invention relates to voltage control oscillators (VCOs), and in particular, to tunable capacitance circuits for fine-tuning the frequency of the VCO.

2. Description of the Related Art

Voltage control oscillators play a critical role in many circuits, particularly wireless communication circuits. With the increased use and complexity of wireless communication devices, such circuits have become increasingly sophisticated. Common characteristics increasingly considered necessary are wide frequency tuning ranges, fast frequency settling times, and low phase noise performance.

Achieving a low phase noise VCO requires a high quality factor (Q) resonant, or "tank", circuit. A VCO tank circuit typically consists of an inductance (L), a capacitance (C) and a negative transconductance (Gm) device. Thus, to achieve low phase noise performance, the VCO tank circuit requires the reactive devices L, C to have high quality factors Q.

Referring to FIG. 1, one example of a conventional VCO circuit 10 includes two bipolar junction transistors Q1, Q2 as the negative transconductance Gm devices, with feedback capacitances Cf1, Cf2, tank circuit inductances Lt1, Lt2, and tank circuit capacitances Ct1, Ct2, all interconnected substantially as shown. The transistors Q1, Q2 are biased by a bias voltage Vbias and driven by a tail current source 12 which sinks a tail current It through the two transistors Q1, Q2. In this circuit 10, which is a differential circuit, the differential VCO output voltage Vout appears between the collector terminals of the transistors Q1, Q2 across the resonant tank circuit components Lt1, Ct1, Lt2, Ct2.

As noted above, another important parameter is the frequency tuning range of the VCO. A large frequency tuning range is essential for most high performance frequency synthesizers. This requires the VCO to be capable of tuning its nominal, or "carrier", frequency over a large frequency span. To achieve such tunability, a VCO typically uses a variable capacitor, generally referred to as a "varactor". As is well known in the art, a varactor has a capacitance that changes with its tuning voltage. Capacitances Ct1 and Ct2 are varactors for which their respective capacitances are determined by the applied tuning voltage Vtune. A high performance varactor will have a large change in capacitance for a given tuning voltage range, plus a low parasitic capacitance and a high quality factor Q. A large range of capacitances over voltage in conjunction with a low parasitic capacitance directly affects the tuning range capability of the varactor, while the high quality factor Q, as noted earlier, is needed to achieve low phase noise operation.

There are two types of conventional varactors which are used in many designs and are widely supported in integrated circuits containing both bipolar and complementary metal oxide semiconductor (MOS) devices. One is referred to as MOS accumulation-mode varactor and the other is a P-N junction varactor. (Such devises are well known to one of ordinary skill in the art and need not be described in detail here).

Referring to FIG. 2A, a conventional MOS accumulation-mode varactor 20 typically includes a P-type substrate 22, into which an N-well 24 is diffused into which, in turn, two n+ regions 26 are diffused to create contacts within the N-well 24. Over the region 27 which, for a normal MOS transistor would be the channel region, an insulated layer 28 is deposited, often in the form of an oxide. Over this insulator 28 is a gate electrode 30. In accordance with well known MOS accumulation-mode varactor principles, application of a gate-to-bulk voltage Vgb produces a capacitance between the gate G and bulk B electrodes, with such capacitance being tunable, or variable, in conformance with the voltage Vgb.

Alternatively, as is well known in the art, the contact regions 26 can be formed as conventional drain and source regions with a bias voltage (e.g., 0.5 volt) applied at electrode B as desired in conformance with the particular circuit application, with the resulting gate-to-bias voltage Vgb producing a capacitance between the gate G and bias B electrodes, with such capacitance being tunable, or variable, in conformance with such voltage Vgb.

Referring to FIG. 2B, the electrical schematic symbol for the MOS accumulation-mode varactor can be depicted as shown.

Referring to FIG. 2C, the capacitance-versus-voltage (CV) curve associated with such a varactor 20 illustrates the large change in capacitance relative to the applied voltage Vgb within one example of a typical voltage tuning range of between +0.3 and +1.2 volt. (As is well known in the art, this voltage tuning range is typically narrow, as illustrated by this example, and will vary since it is dependent upon the particular semiconductor fabrication materials and processes used.) Such a large change in capacitance means the varactor has a large capacitance tuning range. However, as can be seen, such a large capacitance change exists over a small change in voltage. As a result, the ratio of the change in capacitance to the change in voltage has a high magnitude. This, in turn, in accordance with well known VCO principles, produces a high VCO gain KVCO. As is well known, a high VCO gain KVCO makes the design of a stable frequency synthesizer difficult due to the increased frequency tuning sensitivity. Accordingly, while it is desirable to have large tunable capacitance range, it is also desirable to have such a large tunable capacitance range occur over a similarly large tuning voltage range rather than a small tuning voltage range. This would lower the VCO gain KVCO and thereby decrease the frequency tuning sensitivity over tuning voltage, thereby facilitating fine tuning and stability of the final VCO circuit. Additionally, gate depletion that can occur (depending again upon the particular semiconductor fabrication materials and processes used) beyond the tuning voltage region, as shown in region 21, causes the change in capacitance to reverse, thereby further causing the MOS accumulation-mode varactor to potentially be unsuitable for fine tuning of a VCO over a large tunable voltage range.

Referring to FIG. 3A, a P-N junction varactor 40 typically includes a P-substrate 42 into which an N-well 44 is diffused into which, in turn, a p+ region 46 is further diffused. Over this, similar to the MOS accumulation-mode varactor 20 (FIG. 2A), an insulating layer 48 and electrode 50 are deposited. As is well known in the art, application of a voltage to this electrode 50 and the N-well 44 produces a capacitance which is tunable in conformance with such voltage Vnp.

Alternatively, as is well known in the art, region 44 need not necessarily be an N-well region per se, but can instead be virtually any of a number of regions of the various conventional N-type regions. What is important is the juxtaposition of P-type and N-type regions so as to provide a P-N junction.

Referring to FIG. 3B, the electrical schematic symbol can be depicted as shown.

While the P-N junction varactor has no gate depletion issues, its quality factor Q is dependent upon whether the device is driven by the tuning voltage at its P-terminal or N-terminal. The quality factor Q is higher when the device is driven at its P-terminal.

Referring to FIG. 3C, another characteristic of the P-N junction varactor is a lower range of capacitance values for a given range of tuning voltages. This causes the P-N junction varactor to have a lower capacitance tuning range, thereby producing a lower VCO gain KVCO.

SUMMARY OF THE INVENTION

In accordance with the presently claimed invention, a circuit and method provide a tunable capacitance for a voltage control oscillator (VCO) in which at least one P-N junction varactor and at least one metal oxide semiconductor (MOS) accumulation-mode varactor are effectively coupled and tuned in parallel, thereby providing a net tunable capacitance with which the VCO will realize an optimal combination of quality factor, phase noise, and gain characteristics.

In accordance with one embodiment of the presently claimed invention, a tunable capacitance for a voltage control oscillator (VCO) includes at least one control electrode to convey a tuning voltage, at least one tank electrode to couple to inductive circuitry of a VCO, first and second signal reference electrodes to convey first and second DC bias voltages, and tunable capacitance circuitry. First tunable capacitance circuitry, including at least one P-N junction varactor, is coupled to the at least one control electrode, one or more of the at least one tank electrode and the first signal reference electrode. Second tunable capacitance circuitry, including at least one metal oxide semiconductor (MOS) accumulation-mode varactor, is coupled to the at least one control electrode, one or more of the at least one tank electrode and the second signal reference electrode.

In accordance with another embodiment of the presently claimed invention, a method of providing a tunable capacitance for a voltage control oscillator (VCO) includes:

applying a first DC bias voltage and a tuning voltage to a first tunable capacitance circuit, which includes at least one P-N junction varactor, and in response thereto generating a first tuned capacitance;

applying a second DC bias voltage and the tuning voltage to a second tunable capacitance circuit, which includes at least one metal oxide semiconductor (MOS) accumulation-mode varactor, and in response thereto generating a second tuned capacitance; and combining the first and second tuned capacitances to provide a net tuned capacitance.

BRIEF DESCRIPTION OF THE DRAWINGS

FIG. 2C is a capacitance-versus-voltage curve for a MOS accumulation-mode varactor.

FIG. 3A is a cross-sectional view of a conventional P-N junction varactor.

FIG. 3B is an electrical schematic symbol for a P-N junction varactor.

FIG. 3C is a capacitance-versus-voltage graph for a P-N junction varactor.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
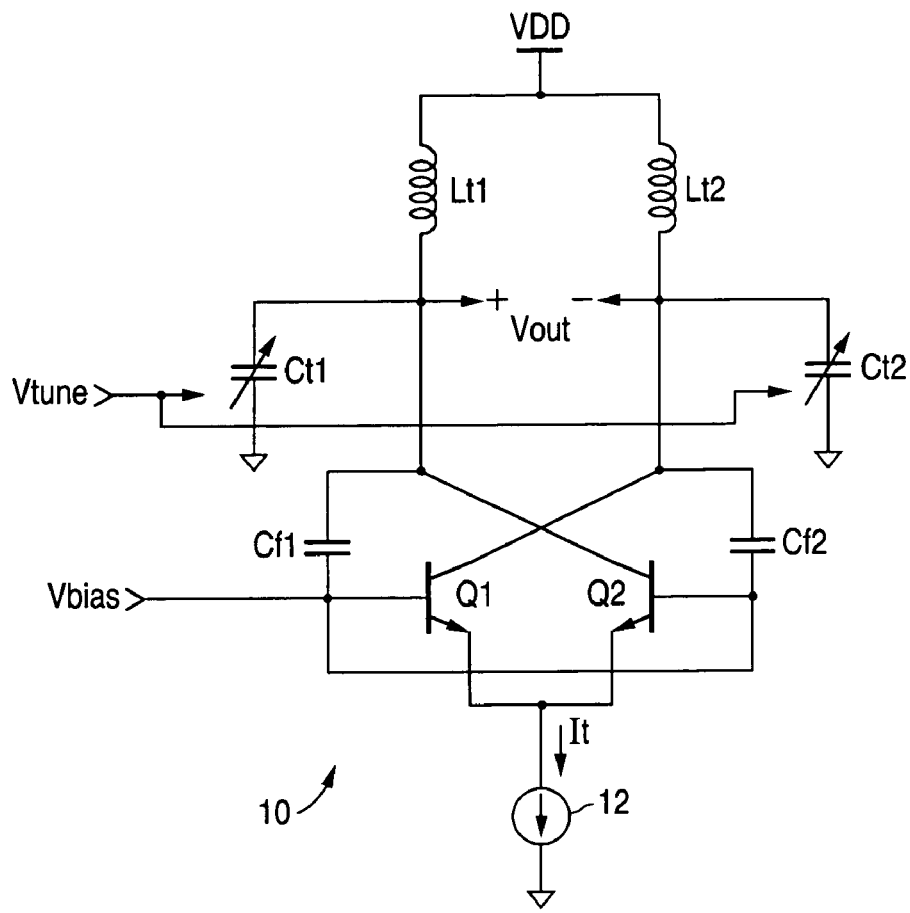
FIG. 1 is a schematic diagram of a conventional VCO circuit.
Figure 2A:
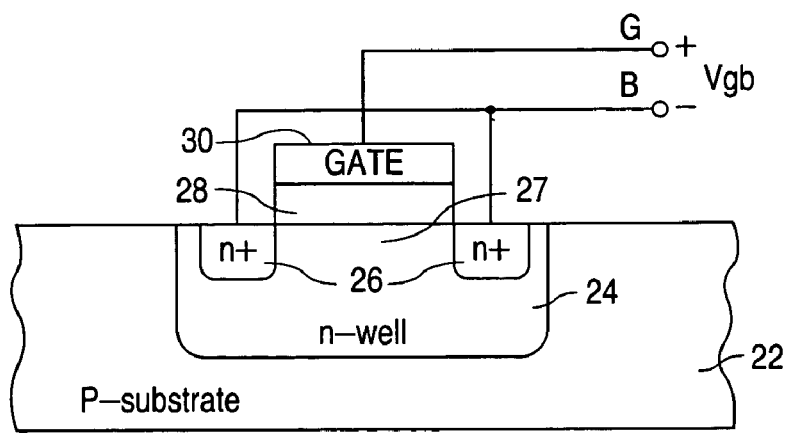
FIG. 2A is a cross-sectional view of a conventional MOS accumulation-mode varactor.
Figure 2B:
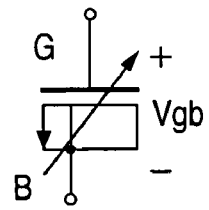
FIG. 2B is an electrical schematic symbol of a MOS accumulation-mode varactor.
Figure 4:
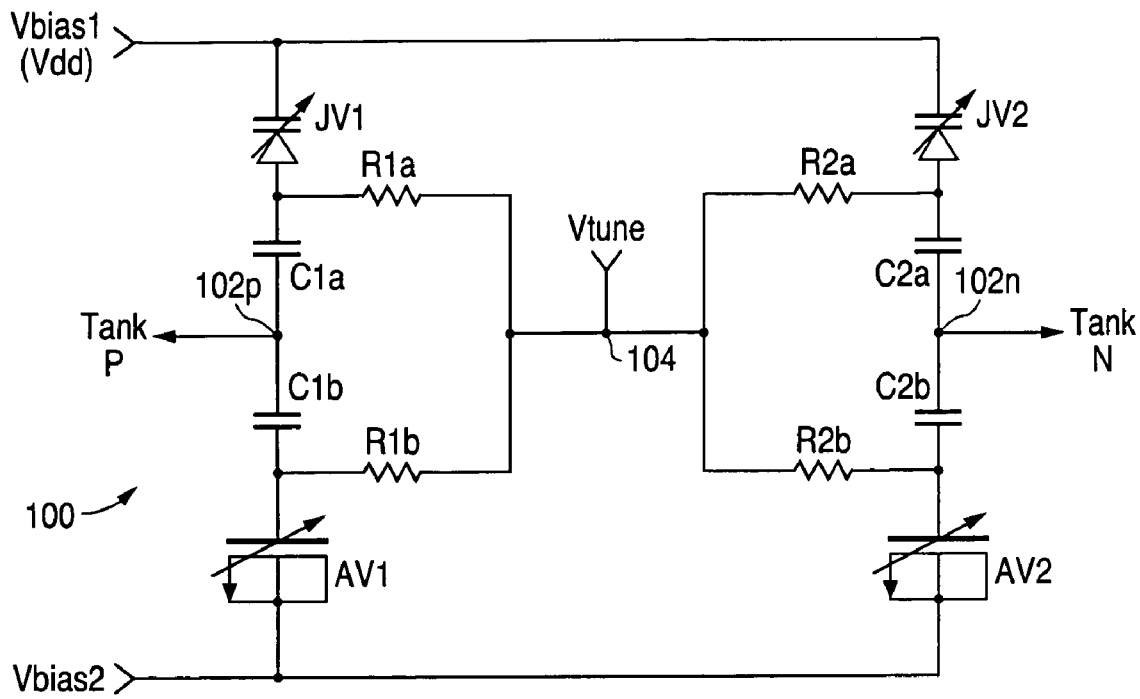
FIG. 4 is a schematic diagram of a tunable capacitance circuit for a VCO in accordance with one embodiment of the presently claimed invention.

Referring to FIG. 4, a tunable capacitance for a VCO in accordance with one embodiment 100 of the presently claimed invention uses one or more MOS accumulation-mode varactors to take advantage of the high quality factor Q and large range of tunable capacitance values, in conjunction with one or more P-N junction varactors to take advantage of the lower gain factor KVCO. The gate depletion of the MOS accumulation-mode varactor is counteracted by the capacitance-versus-voltage behavior of the P-N junction varactor. The MOS accumulation-mode varactors AV1, AV2 are effectively coupled in parallel with P-N junction varactors JV1, JV2, thereby causing their effective capacitances to be combined to provide a net capacitance for the tank circuit via the tank circuit electrodes Tank P, Tank N. As shown for this embodiment 100, the circuitry is connected between two DC bias voltages Vbias1, Vbias2, which also provide the AC grounding. As noted, the first bias voltage Vbias1 can be the positive power rail voltage Vdd. Resistors R1a and R2a provide DC coupling between the control electrode 104 and the anodes, or P-terminals, of the P-N junction varactors JV1, JV2. Capacitors C1a and C2a provide AC coupling between the anodes and the tank circuit electrodes 102p, 102n. Similarly, resistors R1b and R2b provide DC coupling between the control electrode 104 and the gate electrodes of the MOS accumulation-mode varactors AV1, AV2, while capacitors C1b and C2b provide AC coupling between the gate terminals and the tank circuit electrodes 102p, 102n. The cathodes, or N-terminals, of the P-N junction varactors JV1, JV2 are connected to the first signal reference electrode which also conveys the first bias voltage Vbias1, while the bulk (drain or source) electrodes of the MOS accumulation-mode varactors AV1, AV2 are connected to the second signal reference electrode which also conveys the second DC biasing voltage of Vbias2.

Figure 5:
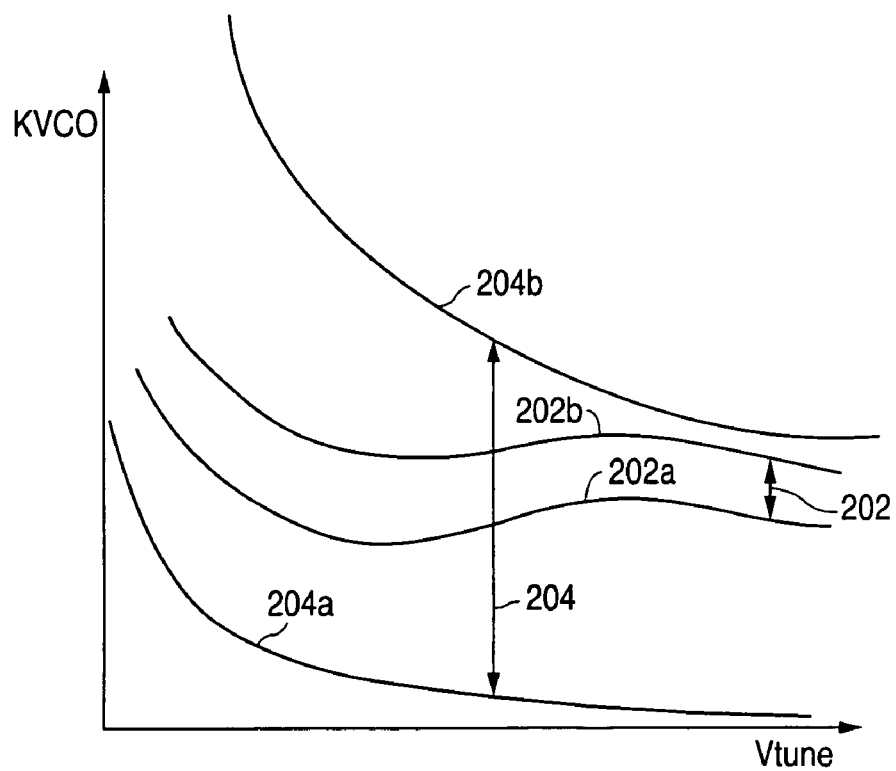
FIG. 5 is a gain-versus voltage graph illustrating the performance differences between the circuit of FIG. 4 and a conventional tunable capacitance circuit.

Referring to FIG. 5, the respective advantages and disadvantages, as discussed above, of the MOS accumulation-mode and P-N junction varactors complement and counteract each other to provide a significantly more consistent and stable gain factor KVCO. For example, simulations of the circuit of FIG. 4 produced a series of gain factors KVCO 202 with minimum 202a and maximum 202b values, over a specified tuning voltage range, while a tuning circuit using only P-N junction varactors produced a series of gain factors KVCO 204 with minimum 204a and maximum 204b values extending over a significantly greater range of values. Hence, as can be readily seen, tuning circuitry in accordance with the presently claimed invention provides for fine frequency tuning with a significantly smaller, i.e., more consistent, range of VCO gain KVCO values, thereby making the host phase lock loop (PLL) circuit significantly more stable.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a tunable capacitance for a voltage control oscillator (VCO), comprising:
    at least one control electrode to convey a tuning voltage;
    at least one tank electrode to couple to inductive circuitry of a VCO;
    first and second signal reference electrodes to convey first and second DC bias voltages;
    first tunable capacitance circuitry, including at least one P-N junction varactor with anode and cathode electrodes, coupled to said at least one control electrode, one or more of said at least one tank electrode and said first signal reference electrode; and
    second tunable capacitance circuitry, including at least one metal oxide semiconductor (MOS) accumulation-mode varactor with gate, drain and source electrodes, coupled to said at least one control electrode, one or more of said at least one tank electrode and said second signal reference electrode;
    wherein:
    said anode electrode is coupled to said at least one control electrode;
    said cathode electrode is coupled to said first signal reference electrode;
    said gate electrode is coupled to said one or more of said at least one tank electrode; and
    said drain and source electrodes are coupled to said second signal reference electrode.

2. The apparatus of claim 1, wherein said first tunable capacitance circuitry is DC-coupled to said at least one control electrode, AC-coupled to said one or more of said at least one tank electrode and DC-coupled to said first signal reference electrode.

3. The apparatus of claim 1, wherein said at least one P-N junction varactor is DC-coupled to said at least one control electrode, AC-coupled to said one or more of said at least one tank electrode and DC-coupled to said first signal reference electrode.

4. The apparatus of claim 1, wherein said second tunable capacitance circuitry is DC-coupled to said at least one control electrode, AC-coupled to said one or more of said at least one tank electrode and DC-coupled to said second signal reference electrode.

5. The apparatus of claim 1, wherein said at least one MOS accumulation-mode varactor is DC-coupled to said at least one control electrode, AC-coupled to said one or more of said at least one tank electrode and DC-coupled to said second signal reference electrode.

6. The apparatus of claim 1, wherein said first tunable capacitance circuitry comprises:
    said at least one P-N junction varactor coupled to said first signal reference electrode;
    resistive circuitry coupled to said at least one P-N junction varactor and said at least one control electrode; and
    capacitive circuitry coupled to said at least one P-N junction varactor and said at least one tank electrode.

7. The apparatus of claim 6, wherein said at least one P-N junction varactor includes:
    at least one N-electrode coupled to said first signal reference electrode; and
    at least one P-electrode coupled to said resistive circuitry and said capacitive circuitry.

8. The apparatus of claim 1, wherein said second tunable capacitance circuitry comprises:
    said at least one MOS accumulation-mode varactor coupled to said second signal reference electrode;
    resistive circuitry coupled to said at least one MOS accumulation-mode varactor and said at least one control electrode; and
    capacitive circuitry coupled to said at least one MOS accumulation-mode varactor and said at least one tank electrode.

9. The apparatus of claim 8, wherein said at least one MOS accumulation-mode varactor includes:
    a plurality of bulk electrodes coupled to said second signal reference electrode; and
    at least one gate electrode coupled to said resistive circuitry and said capacitive circuitry.

10. A method of providing a tunable capacitance for a voltage control oscillator (VCO) comprising:
    applying a first DC bias voltage and a tuning voltage to a first tunable capacitance circuit, which includes at least one P-N junction varactor with anode and cathode electrodes, by applying said tuning voltage to said anode electrode and applying said first DC bias voltage to said cathode electrode, and in response thereto generating a first tuned capacitance;
    applying a second DC bias voltage and said tuning voltage to a second tunable capacitance circuit, which includes at least one metal oxide semiconductor (MOS) accumulation-mode varactor with gate, drain and source electrodes, by applying said second DC bias voltage to said drain and source electrodes, and in response thereto generating a second tuned capacitance; and
    combining said first and second tuned capacitances to provide a net tuned capacitance for a VCO by coupling at least said gate electrode to inductive circuitry of said VCO.

11. The method of claim 10, wherein said applying a first DC bias voltage and a tuning voltage to a first tunable capacitance circuit, which includes at least one P-N junction varactor with anode and cathode electrodes, by applying said tuning voltage to said anode electrode and applying said first DC bias voltage to said cathode electrode, and in response thereto generating a first tuned capacitance comprises DC-coupling said first tunable capacitance circuit to at least one control electrode, AC-coupling said first tunable capacitance circuit to at least one tank electrode and DC-coupling said first tunable capacitance circuit to a signal reference electrode.

12. The method of claim 10, wherein said applying a first DC bias voltage and a tuning voltage to a first tunable capacitance circuit, which includes at least one P-N junction varactor with anode and cathode electrodes, by applying said tuning voltage to said anode electrode and applying said first DC bias voltage to said cathode electrode, and in response thereto generating a first tuned capacitance comprises DC-coupling said at least one P-N junction varactor to at least one control electrode, AC-coupling said at least one P-N junction varactor to at least one tank electrode and DC-coupling said at least one P-N junction varactor to a signal reference electrode.

13. The method of claim 10, wherein said applying a second DC bias voltage and said tuning voltage to a second tunable capacitance circuit, which includes at least one metal oxide semiconductor (MOS) accumulation-mode varactor with gate, drain and source electrodes, by applying said second DC bias voltage to said drain and source electrodes, and in response thereto generating a second tuned capacitance comprises DC-coupling said second tunable capacitance circuitry to said at least one control electrode, AC-coupling said second tunable capacitance circuitry to said one or more of said at least one tank electrode and DC-coupling said second tunable capacitance circuitry to said second signal reference electrode.

14. The method of claim 10, wherein said applying a second DC bias voltage and said tuning voltage to a second tunable capacitance circuit, which includes at least one metal oxide semiconductor (MOS) accumulation-mode varactor with gate, drain and source electrodes, by applying said second DC bias voltage to said drain and source electrodes, and in response thereto generating a second tuned capacitance comprises DC-coupling said at least one MOS accumulation-mode varactor to said at least one control electrode, AC-coupling said at least one MOS accumulation-mode varactor to said one or more of said at least one tank electrode and DC-coupling said at least one MOS accumulation-mode varactor to said second signal reference electrode.

15. The method of claim 10, wherein said applying a first DC bias voltage and a tuning voltage to a first tunable capacitance circuit, which includes at least one P-N junction varactor with anode and cathode electrodes, by applying said tuning voltage to said anode electrode and applying said first DC bias voltage to said cathode electrode, and in response thereto generating a first tuned capacitance comprises:

coupling said at least one P-N junction varactor to a signal reference electrode;
coupling resistive circuitry to said at least one P-N junction varactor and at least one control electrode; and
coupling capacitive circuitry to said at least one P-N junction varactor and at least one tank electrode.

16. The method of claim 15, wherein:
said coupling said at least one P-N junction varactor to a signal reference electrode comprises coupling at least one N-electrode of said at least one P-N junction varactor to said signal reference electrode; and
said coupling resistive circuitry to said at least one P-N junction varactor and at least one control electrode comprises coupling at least one P-electrode of said at least one P-N junction varactor to said resistive circuitry; and
said coupling capacitive circuitry to said at least one P-N junction varactor and at least one tank electrode comprises coupling said at least one P-electrode of said at least one P-N junction varactor to said capacitive circuitry.

17. The method of claim 10, wherein said applying a second DC bias voltage and said tuning voltage to a second tunable capacitance circuit, which includes at least one metal oxide semiconductor (MOS) accumulation-mode varactor with gate, drain and source electrodes, by applying said second DC bias voltage to said drain and source electrodes, and in response thereto generating a second tuned capacitance comprises:

coupling said at least one MOS accumulation-mode varactor to a signal reference electrode;
coupling resistive circuitry to said at least one MOS accumulation-mode varactor and at least one control electrode; and
coupling capacitive circuitry to said at least one MOS accumulation-mode varactor and at least one tank electrode.

18. The method of claim 17, wherein:
said coupling said at least one MOS accumulation-mode varactor to a signal reference electrode comprises coupling a plurality of bulk electrodes of said at least one MOS accumulation-mode varactor to said second signal reference electrode;
said coupling resistive circuitry to said at least one MOS accumulation-mode varactor and at least one control electrode comprises coupling at least one gate electrode of said at least one MOS accumulation-mode varactor to said resistive circuitry; and
said coupling capacitive circuitry to said at least one MOS accumulation-mode varactor and at least one tank electrode comprises coupling said at least one gate electrode of said at least one MOS accumulation-mode varactor to said capacitive circuitry.

* * * * *